(12) United States Patent
Shamouilian et al.

(10) Patent No.: US 6,432,282 B1
(45) Date of Patent: Aug. 13, 2002

(54) METHOD AND APPARATUS FOR SUPPLYING ELECTRICITY UNIFORMLY TO A WORKPIECE

(75) Inventors: Shamouil Shamouilian, San Jose; Anada H. Kumar, Milpitas; Donald J. Olgado, Palo Alto; Joseph J. Stevens, San Jose; Ricardo Leon, Palo Alto; Jon Clinton, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/518,182

(22) Filed: Mar. 2, 2000

(51) Int. Cl.[7] .............................. B23H 7/04; B23H 7/14; C25B 9/04
(52) U.S. Cl. ................................ 204/228.1; 204/229.8; 204/230.2; 204/230.8; 204/286.1
(58) Field of Search ...................... 204/229.8, 230.2, 204/286.1, 230.8, 224 R, 228.1

(56) References Cited

U.S. PATENT DOCUMENTS 5,156,730 A  * 10/1992  Bhatt et al. .................. 205/118
5,503,730 A  *  4/1996  Osano et al. .................. 205/83
5,885,469 A      3/1999  Kholodenko et al. ......... 216/11
6,071,388 A  *  6/2000  Uzoh ...................... 204/297 R

FOREIGN PATENT DOCUMENTS

WO      WO 99/25905      5/1999      ............ C25D/5/02

* cited by examiner

Primary Examiner—Robert Dawson
Assistant Examiner—Michael J Feely
(74) Attorney, Agent, or Firm—Moser, Patterson & Sheridan, LLP

(57) ABSTRACT

The present invention relates to a device that supplies electricity to a substrate. In one embodiment, the device includes multiple contacts, a current sensor, and a current regulator. The current sensor is attached to each of the plurality of contacts to sense their electric current. A current regulator controls current applied to each of the multiple contacts in response to the current sensor. In another embodiment, a compliant ridge is formed about the periphery of each contact to seal the contact from undesired chemicals.

11 Claims, 5 Drawing Sheets

US 6,432,282 B1

METHOD AND APPARATUS FOR SUPPLYING ELECTRICITY UNIFORMLY TO A WORKPIECE

BACKGROUND OF THE DISCLOSURE

1. Field of the Invention

The invention relates to supplying electrical contacts for applying electrical power to a substrate in a metal depositing system. More particularly, the invention relates to a method and apparatus for uniformly applying electricity to a workpiece in an electroplating system.

2. Description of the Background Art

Sub-quarter micron, multi-level metallization is an important technology for the next generation of ultra large scale integration (ULSI). Reliable formation of these interconnect features permits increased circuit density, improves acceptance of ULSI, and improves quality of individual processed wafers. As circuit densities increase, the widths of vias, contacts and other features, as well as the width of the dielectric materials between the features, decrease. However, the height of the dielectric layers remains substantially constant. Therefore, the aspect ratio for the features (i.e., their height or depth divided by their width) increases. Many traditional deposition processes, such as physical vapor deposition (PVD) and chemical vapor deposition (CVD), presently have difficulty providing uniform features having aspect ratios greater than 4/1, and particularly greater than 10/1. Therefore, a great amount of ongoing effort is directed at the formation of void-free, nanometer-sized features having aspect ratios of 4/1, or higher.

Electroplating, previously limited in integrated circuit design to the fabrication of lines on circuit boards, is being used to fill vias and contacts. Metal electroplating, in general, can be achieved by a variety of techniques. One embodiment of an electroplating process involves initially depositing a barrier layer over the feature surfaces of the wafer, depositing a conductive metal seed layer over the barrier layer, and then depositing a conductive metal (such as copper) over the seed layer to fill the structure/feature. Finally, the deposited layers are planarized by, for example, chemical mechanical polishing (CMP), to define a conductive interconnect feature.

Damascene processes comprise those processes in which metal conductive layers are applied to fill troughs formed in insulative material. The surface of the metal conductive material is then etched to provide a smooth-surfaced insulated conductor formed in the insulative material. Effectiveness and success of the damascene and dual-damascene processes (that are used in such applications as fabricating highly conductive copper wiring on silicon wafers) depends largely upon the uniformity of copper layers deposited. The effectiveness also depends on the partial removal of the copper layer by chemical-mechanical polishing.

In electroplating, depositing of a metallic layer is accomplished by delivering electric power to the seed layer and then exposing the wafer-plating surface to an electrolytic solution containing the metal to be deposited. The subsequently deposited metal layer adheres to the seed layer (as well as a conformal layer) to provide for uniform growth of the metal layer. A number of obstacles impair consistently reliable electroplating of metal onto wafers having nanometer-sized, high aspect ratio features. These obstacles include non-uniform power distribution and current density to across the wafer plating surface.

In metal deposition systems, several things may lend to uneven depositing of the metal layer. One major contributor to a non-uniform deposition of process time dependent variations in material buildup upon the different contacts 56. Each contact will thus develop unique and unpredictable geometric profiles and densities, thus producing varying and unpredictable resistances when exposed to a similar voltage. The varying resistance of the individual contacts 56 results in a non-uniform current density distribution across the wafer. The varying resistances of the contacts provide modified electrical fields. In addition, the contact resistance at the contact/seed layer interface may vary from wafer 48 to wafer, resulting in inconsistent plating distribution between different wafers using the same equipment.

The power supply circuit that supplies current to the seed layer includes the plurality of contacts 56 located on a contact ring. In electroplater embodiments, a single power supply applies electricity to a junction that is electrically connected to all of the metal contacts 56. The electrical characteristics of different contacts may vary, especially after prolonged use. Those metal contacts having a higher resistance provide less electrical current to the adjacent seed layer. If an equal voltage is applied to each metal contact, these contacts with increased resistance also have a higher current flowing therethrough as indicated by Ohm's law. Non-uniform power distribution and current desities are applied to the seed layer across the wafer plating surface as a result of the varied electrical current applied by the contacts. This inequality of non-uniform power distribution and current densities results in uneven deposition of metal to the seed layer.

Therefore, there remains a need for an apparatus that delivers a uniform electric current to multiple contacts, and to a seed layer deposited on a wafer. such a device would provide substantially uniform electrical power distribution to a wafer surface n an electroplating cell, enabling deposition of reliable and consistent conductive metallic layers on wafers.

SUMMARY OF THE INVENTION

The present invention generally provides a method and apparatus that supplies electricity to a substrate. In one embodiment, the device includes multiple contacts, a current sensor, and a current regulator. The current sensor is attached to each of the plurality of contacts to sense their electric current. A current regulator controls current applied to each of the multiple contacts in response to a signal produced by the current sensor.

In another embodiment, a compliant ridge is formed about the periphery of each contact that can form a seal about the contacts. The compliant ridge may be formed by either applying a thick conductor layer resulting in a ridge defined in an external surface of the conformal layer. Alternately, the compliant ridge may be formed as an additional layer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
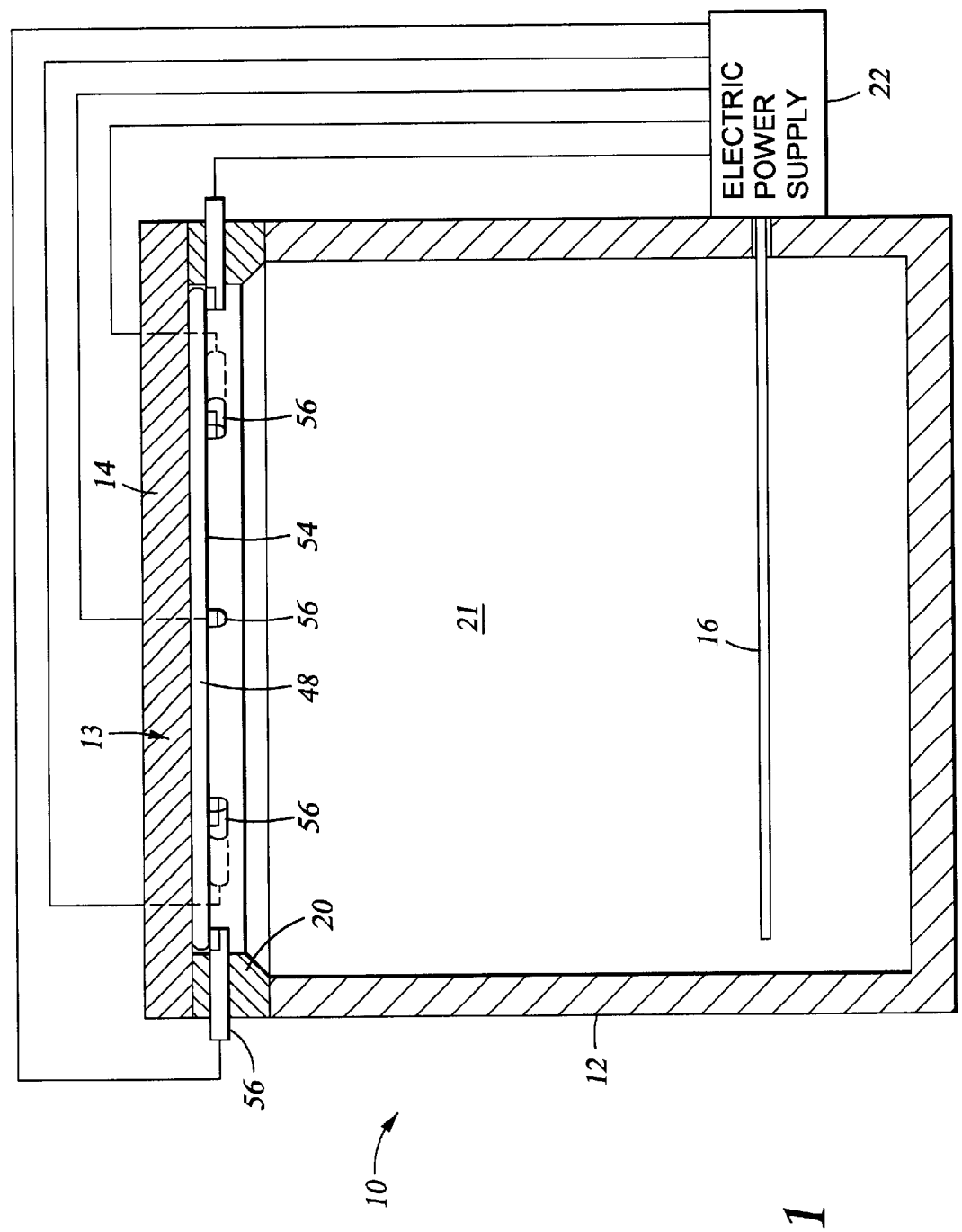
FIG. 1 shows a simplified side cross sectional view of a one embodiment of fountain plater of the present invention.

After considering the following description, those skilled in the art will clearly realize that the teachings of this invention can be readily utilized in any metallic deposition application, such as electroplating.

1. Component Structure

A fountain plater 10 comprises an electrolyte container 12, an anode 16, a power supply 22, a contact ring 20, a plurality of contacts 56, and a wafer support 14. The electrolyte container 12 contains an electrolyte used to deposit metal upon a substrate such as a wafer. A wafer 48 is fixed to the wafer support 14 and then is inserted into the electrolyte in container 12 for depositing metal thereupon. A copper layer is deposited by electroplating from a copper containing electrolyte onto areas of the wafer 48 that have typically previously been covered by a previously formed copper seed layer. FIG. 2 depicts a power supply 22 of one embodiment of the present invention that senses and controls electrical current supplied to contacts 56 located in the fountain plater 10 shown in FIG. 1. Even though the fountain plater 10 is shown and described relative to the present disclosure, any process chamber comprising contacts 56 that deposits metal on a wafer or other substrate is intended to be within the scope of the present invention.

Figure 2:
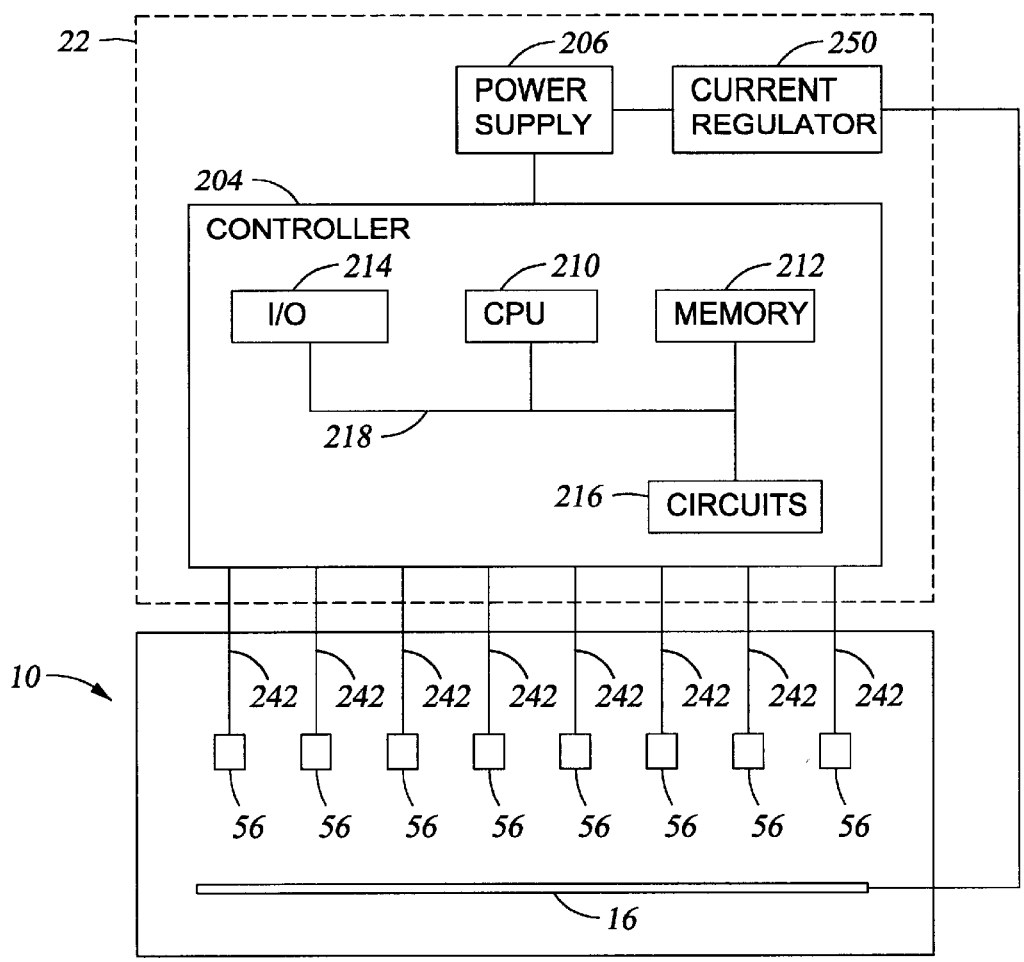
FIG. 2 shows a schematic diagram of one embodiment of power supply of the resent invention that may be used with the fountain plater of FIG. 1.

In FIG. 1, the contacts 56 are electrically coupled to an electric power supply 22. Any contact structure that contacts a seed layer disposed on a substrate is within the intended scope of the term "contacts" as used within this disclosure (e.g., contact comprise contact rods and contact pins, as well as other known contact structures). The fountain plater 10 includes an electrolyte container 12 into which the wafer 48 attached to wafer support 14 can be disposed through an opening 13. An anode 16 is disposed near the bottom of the electrolyte container 12. A contact ring 20 is configured to maintain the wafer in position such that electricity may be supplied from the contacts 56 located in the contact ring 20. The wafer support 14 is supported by edges of opening 13 to form an enclosure 21 containing electrolyte solution. The circular electrical contact ring 20 facilitates electrical contact with the seed layer (not shown) disposed on the wafer plating surface 54 formed on the wafer 48. A portion of the seed layer includes a seed layer contact portion preferably positioned near the periphery of the wafer 48. This location of the seed layer provides an effective contact with contacts 56. An input source and output source for electrolyte solution (neither of which are shown) are connected to the electrolyte container 12 to respectively provide, and drain, electrolyte solution to, and from, the electrolyte container 12.

Typically, the contacts 56 are formed from materials, or alloys, including conductive material such as tantalum (Ta), titanium (Ti), platinum (Pt), gold (Au), copper (Cu), or silver (Ag). The portion of the contacts 56 that are located inside of the contact ring 20, are configured to minimize the electrical field generated thereby (and mechanical binding effects of the contacts 56) on the wafer 48. The wafer 48 is secured within and located on top of the cylindrical electrolyte container 12 that axially conforms to the shape of the wafer 48. Electrolyte flow impinges perpendicularly on a wafer plating surface 54 of the wafer 48 during operation of the fountain plater 10.

During operation, the wafer 48 interacts with the anode 16 as a cathode, and may be considered as a work-piece having a metal controllably layered thereupon. Typically, the contact ring 20 comprises a plurality of metallic or semi-metallic contacts 56. If a contact 56 is exposed to the electrolyte, the seed layer will accumulate plating deposits. Deposits on the contacts 56 change their physical, electrical, and chemical characteristics and eventually degrade the electrical performance of the contact ring 20. Such degradation results in uneven plating on the wafer due to non-uniform current distribution.

FIG. 2 depicts a power supply 22 of one embodiment of the present invention associated with fountain plater 10. This embodiment provides a design for the power supply that supplies power to individual contacts in which the electric currents supplied among the different contacts 56 are balanced even if the resistance of each contact 56 differs. The power supply 22 provides a more uniform electric current density (and application of electric current density) to the seed layer, even in those instances that contacts 56 have unequal resistances. An individual conductor with feedback portion 242 connects each contact 56 individually to a controller 204. Each individual conductor with feedback portion 242 senses the electric current being applied to its particular contact 56, and provides input to the controller 204 indicative of the electric current. The controller relies upon this sensed electrical current to balance the electric current between the different contacts 56 (if necessary), as described below.

Figure 3:
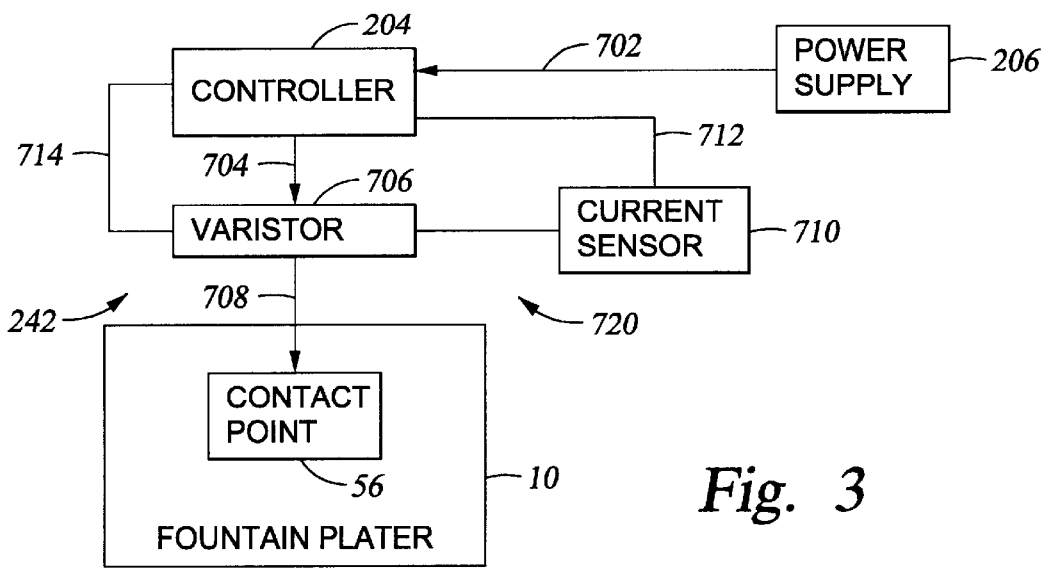
FIG. 3 shows a schematic diagram of an individual conductor with a feedback portion 242 of FIG. 2 of one embodiment of the present invention.

The structure of one embodiment of an individual conductor with a feedback portion 242 associated with power supply 206 and controller 204 is shown in detail in FIG. 3. The individual conductor with a feedback portion 242 comprises power conductors 702, 704, and 708; a varistor (variable resistor) 706; a current sensor 710; and control conductors 712 and 714. The power conductor 702 supplies sufficient electric current from the power supply 206 to the controller 204 to satisfy the electrical and electronic requirements for the operation of the controller 204 and the fountain plater 10. Power conductors 704 and 708 (with varistor 706 interspaced therebetween) provide controlled electric power from the controller 204 to the contact 56 in the fountain plater 10. The current sensor 710 determines the current flowing through the power conductor 708, and transmits this information (preferably in digital form) back to the controller 204.

A current regulator portion 720 of the controller 204 provides a control signal to varistor 706. The varistor responds by increasing, or decreasing the its resistance that controls the electric current supplied to the contact 56 if the contact is receiving respectively more or less current than other contacts. That the varistors 706 associated with the different individual feedback portions 242 should function in an integrated fashion. Nearly identical electric currents will then be applied from each individual conductor with feedback portion 242 to their respective contact 56.

In one embodiment, the electrical current applied to every individual contact 56 may be reduced by the amount that the electric current to that individual contact exceeds the electric current supplied to the particular contact in the fountain plater that is receiving the least electric current. This reduction in electric current may result from increasing the resistance in the varistor 706 by a suitable amount, as determined by controller 204. The controller 204 operates continuously such that the relative resistance levels in the varistors 706 continuously regulate the electrical current supplied to the contacts.

In an alternate embodiments, the electric current supplied by the controller 204 to those contacts 56 that receive less electric current than other contacts may receive more electrical current by increasing a current supplied by current regulator (not shown) located in controller 204. Alternately, controller 204 may decrease the electric current supplied by the controller 204 to those contacts 56 that are receiving more electrical current than other contacts 56. Any technique by which electric currents supplied to different contacts 56 are varied based upon the sensed electric currents applied to those contacts 56 (to balance the electric current applied between the multiple contacts) is within the intended scope of this invention.

Operationally, controller 204 may be viewed as including two portions, the current sensor portion and the current regulator portion. Each of these two portions is not depicted separately in the figures since their operation is related and involves so much of the same equipment. The controller 204 comprises central processing unit (CPU) 210, memory 212, input/output circuits (I/O) 214, circuit portion 216, and system bus 218. The controller 204 may be fashioned as a personal computer (PC), a microcomputer, a networked-computer, a mainframe, a microprocessor, or any other known type of computer, the operations of which is generally known in the art and will not be further detailed herein for brevity.

The CPU 210 performs the processing and arithmetic functions of the controller 204. The CPU 210 is preferably a type such as produced by Intel Corporation, Texas Instruments, or Advanced Micro Devices, and whose operation is known to those skilled in the art. The memory 212 includes random access memory (RAM) and read only memory (ROM) that together store, and access, the programs, operands, system parameters, and other necessary parameters for controlling the operation of the power supply 22. System bus 218 provides for transmission of digital information between the CPU 210, the memory 212, the support circuits 216, and the I/O circuits 214. The bus 218 also transmits the necessary information between the elements CPU 210, memory 212, I/O circuits 214 and support circuits 216 that the bus 218 is connected to with fountain plater 10.

The I/O circuits 214 provide an interface to control the transmission of digital information between each of the components in the controller 204. The I/O circuits 214 also provide an interface between the components of the controller 204 and different portions of the fountain plater 10. The support circuit portion 216 comprises all of the other user interface portions (such as display and keyboard), system devices, and additional devices associated with the controller 204. While the controller 204 is described as a digital device, it is within the scope of the present invention that an analog device that performs similar functions is also within the intended scope of the present invention. Also shown in FIG. 2 is a current regulator 250 that controls the electric current supplied from power supply 206 to the anode 16.

Such interconnections between the controller 204 and the contacts 56 can be fabricated using known fabrication techniques involving single or multi-layer thin film wiring methods on appropriate wafers.

2. Manufacture of Wafer Contacts

A manufacturing process that uses contact ring 20 of the type used in the FIG. 2 embodiment is now described. This embodiment of manufacturing provides for contacts 56, which lends to the fabrication of the necessary wiring structures that compares the current flowing into the individual contacts. This embodiment provides a configuration of electrical contacts that permit the re-balancing of electrical currents between the different contacts 56, as described above.

The wiring network and the contacts 56 can be fabricated as a metal network. The preferred metal is a copper-beryllium alloy that is available in strip form and widely used in electrical contacts due to the high spring factor, good formability, and relatively high electrical conductivity. One example of the method of fabrication is illustrated in FIG. 6, which comprises FIGS. 6A to 6I.

Figure 6A:
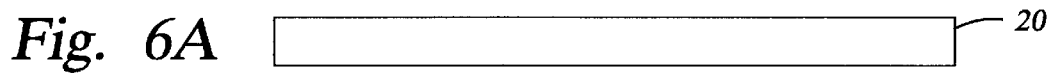
FIG. 6, comprising of FIGS. 6A to 6I, shows a cross sectional view of one embodiment of a contact substrate fabrication progression.
Figure 6B:
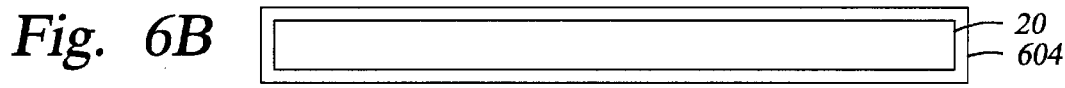

In FIG. 6A, the contact ring 20 (preferably made from beryllium-copper) is deburred, and the contact ring 20 is electroplated with nickel having a thickness of 5 $\mu$m. In FIG. 6B, a 15–20 $\mu$m polyimide coat 604 covers both the sides and the edges of the contact ring 20. Polyimides are well known for their use as dielectrics, though any other dielectric that can be applied in the manner described below is intended to be within the scope of the present invention. The wafer is then cured at 300 to 400 degrees Celsius.

Figure 5:
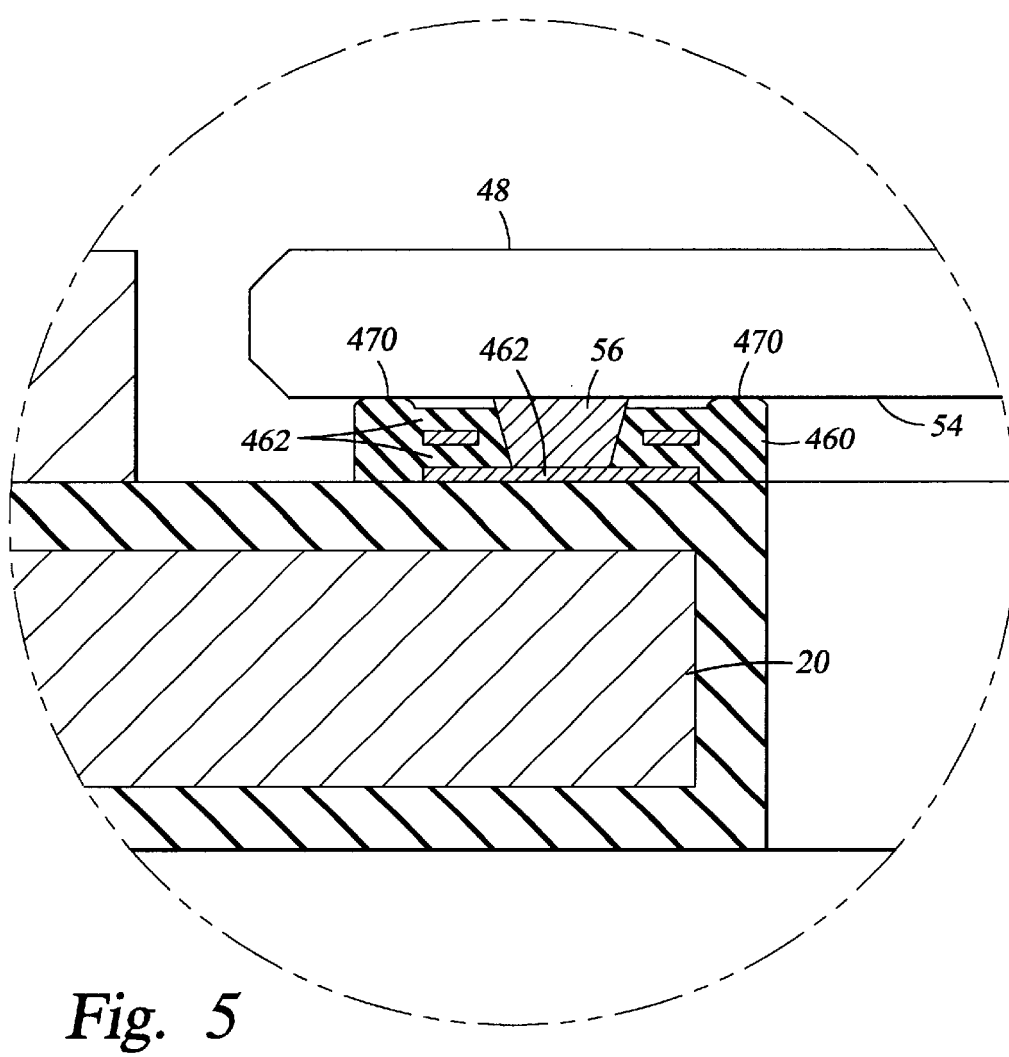
FIG. 5 shows an expanded view of the elements within portion 410 of FIG. 4.
Figure 6C:
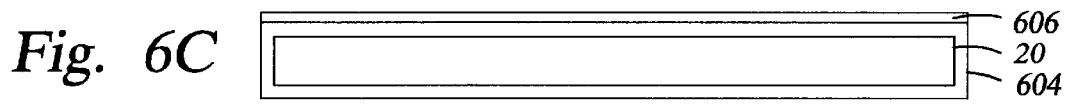

In FIG. 6C, a Cr—Cu—Cr sputter layer 606 is applied to the upper surface of the contact ring 20. The inner chromium layer is provided as a protective layer to limit adverse affects to the copper layer. The copper layer is provided as the conductive layer, and the outer chromium layer is provided as another protective layer. The protective chromium layer (s) may be removed while remaining within the intended scope of the present invention. The Cr—Cu—Cr sputter layer 606 shown in FIG. 6C includes about 200 Angstroms Chromium, about 10–25 $\mu$m copper, and then about 200 Angstroms Chromium. The 10–25 $\mu$m of copper is relatively thick compared to existing fabrication techniques, and provides for a build-up, or compliant ridges 470, in latter fabrication layers, as shown in FIG. 5. The chromium in the Cr—Cu—Cr sputter layer 606 is provided as a protective layer that limits oxidation of the copper.

Figure 6D:
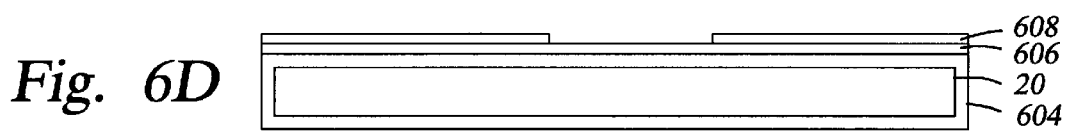
Figure 6E:
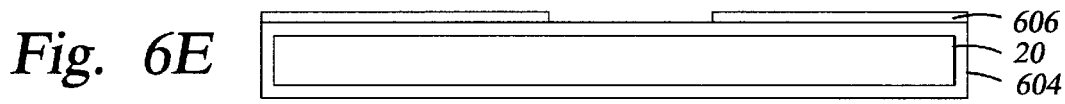

In FIG. 6D, photo-resist (not shown) is then applied to the wafer to begin the process of selectively removing the Cr—Cu—Cr sputter layer 606. The photo-resist is then soft baked. The photo-resist may be either a positive or a negative photo-resist, as desired. The photo-resist is then exposed, using mask 608, to define the first wiring level. In FIG. 6E, a subtractive etch layer (one embodiment of which comprises ammonium persulfate) is applied to remove those portions of the Cr—Cu—Cr sputter layer 606 that have not been protected by the photo-resist. The subtractive etch portion, other etching techniques may also be used, (using plasma etching, reactive ion etching, liquid etching, or other suitable techniques) is thus returned to the polyimide layer.

Figure 6F:
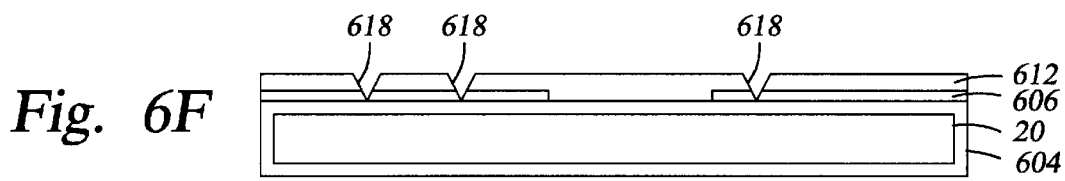
Figure 6G:
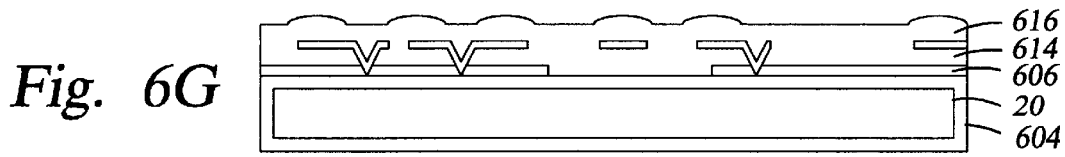

In FIG. 6F, photosensitive polyimide (PSPI) 612 is then applied and soft baked. The PSPI is then exposed, developed, and cured. Polyimide is an electrical dielectric. The steps illustrated in FIGS. 6C to 6F are then repeated in FIG. 6F to provide as many conductive wiring layers 614, 616, between the successive layers of polyimide, as desired. In FIG. 6G, the portions of the photosensitive polyimide that are removed at 618, in FIG. 6F during the exposing and processing portions provide for vias to lower layers, if necessary. The multiple layers may be utilized to provide a multi-layer conductive configuration as indicated in FIG. 6G.

Figure 6H:
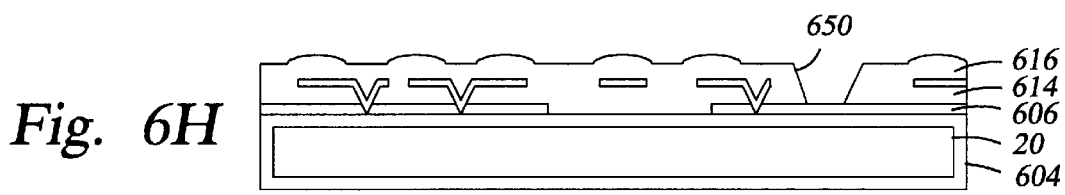
Figure 6I:
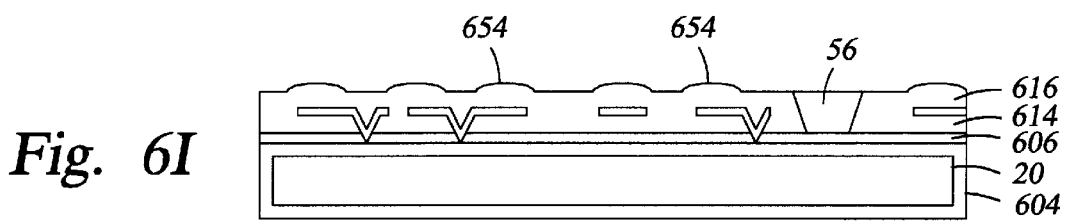

In FIG. 6H, a laser is used to ablate a contact hole 650 through the multiple layers down to, but not including, the polyimide coat layer 604 shown in FIG. 6B. This process provides for a contact 56 extending to the polyimide coat layer 604. In FIG. 6I, contacts 56, preferably formed from platinum, are electroplated into the contact holes 650 produced in FIG. 6H.

Figure 4:
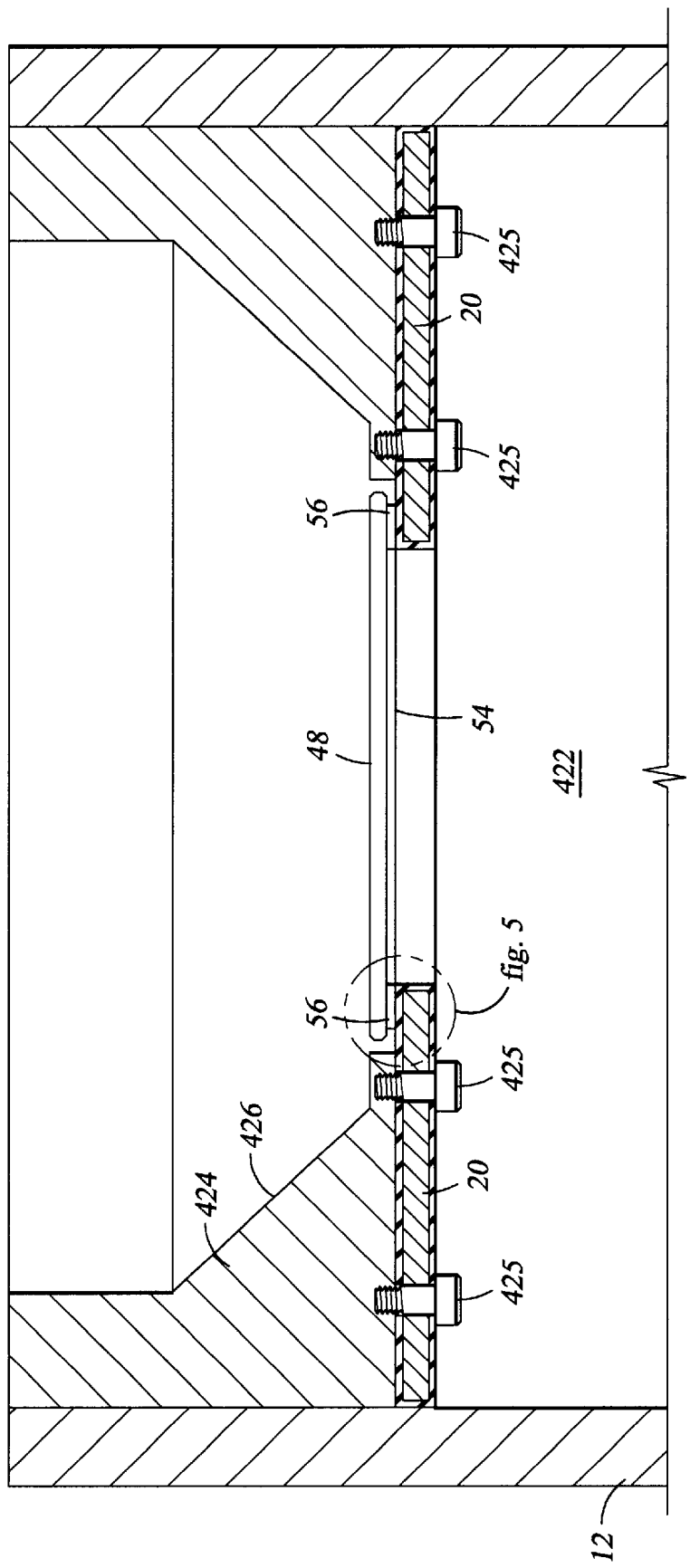
FIG. 4 shows a side cross sectional view of a wafer holding fixture of one embodiment of the present invention.
Figure 7:
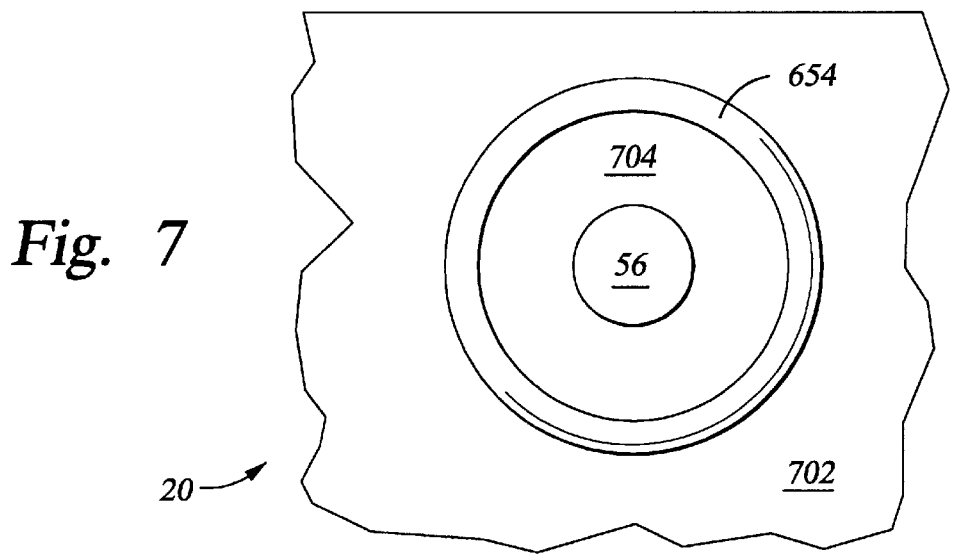
FIG. 7 shows a top view of one embodiment of compliant ridge.

A benefit of the method depicted in FIGS. 6A to 6G is that compliant ridges 654 are formed surrounding each contact 56. The compliant ridges 654, when compressed as shown in FIGS. 4 and 5, seal the contacts 56 from the electrolyte solution contained in the enclosure 21 of the electrolyte container 12 of FIG. 1. In one embodiment of the present invention, coating thick (25 $\mu$m) copper features in the Cr—Cu—Cr sputter layer 606 forms the compliant ridges 654 as shown in FIG. 6C. The compliant ridges surround the contact as shown in FIG. 7. This surface topography can be engineered to provide compressible compliant ridges or dams 654 that are raised compared to the surrounding surface due to the thicknesss of the Cr—Cu—Cr layer. The raised compressible compliant ridges or dams extending around the contacts 652 "pinch off" exposure of the plating solution to the contacts 56 when the compliant ridges contact and are compressed against the substrate 48. FIG. 7 shows the top view of the compliant ridges 652 that extend above surrounding land 702 and interior land 704. The interior land 704 comprises contact 56. The compressible compliant ridges 654 can be made highly reproducible using the above-described thin film process. This sealing of the contacts 56 from the electrolyte limits coating of the contacts 56 by metal contained in the electrolyte. The sealing of the contacts also extends the life of the electrolyte because the electrolyte does not chemically interact with the material of the contacts 56. This sealing of the contacts from the electrolyte makes the electrical characteristics between the different electrical contacts 56 uniform and predictable since the contacts will maintain their original material and configuration longer. In an alternate embodiment of the present invention, the compliant ridges 654 are formed by adding an additional layer of polyimide around a periphery of the contacts 56. This alternate embodiment does not rely upon using a thicker Cr—Cu—Cr sputter layer 606.

FIGS. 4 and 5 show an alternate, and more detailed embodiment, of a wafer support 400 that fits within the electrolyte container 12. The wafer support 400 supports the wafer 48 such that the wafer plating surface 54 is exposed to electrolyte solution contained in the enclosure 21 defined by the container 12. The contact ring 20 (shown in cross section in FIGS. 4 and 5) is attached to an annular support member 424 by insulative fasteners 425, e.g. bolts or screws, formed from a plastic or other corrosion-resistant material. Wafer support 14, shown in FIG. 1, engages and is supported by surfaces 426 formed in the annular support member 424. A plurality of the contacts 56 are spaced about the periphery of the contact ring 20, and supplies electricity to seed layer (not shown) found on wafer plating surface 54.

FIG. 5 shows an expanded view of the elements within a portion 410 of FIG. 4. Dielectric polyimide layer 460 structurally supports the contacts 56. There are multiple electric conductive layers 462 disposed within the dielectric polyimide layers 460. The contacts 56 supply electricity to seed layer that is positioned on the wafer plating surface 54. Compliant ridges 470 (the outer layer is formed from the dielectric polyimide layer 460 in one embodiment) engage wafer plating surface 54 around the periphery of the contacts 56. The compliant ridges limit electrolyte solution from passing from the chamber 422 to the contacts 56. This limiting of exposure of contacts 56 to the electrolyte solution extends the practical life of the contact ring and the electrolyte solution.

The pressure applied to the back of the contact ring 20 is sufficient to flatten the compliant ridges 654 formed around the contacts 652 as described. Such flattening of the compliant ridges 654 enables establishing robust electrical connections to each contact 56. The contact ring 20 is applied with sufficient force to flatten the compliant ridges 654 around the contact holes 650 and thereby bias the contacts 652 against the wafer. This force provides consistent sealing action that limits fluid passage between the contacts 56 and the seed layer formed on the wafer plating surface 54 of contact ring 20.

The structure of the contact ring 20, including the contacts 56 and the compliant ridges, can also be formed in an alternate embodiment as a flexible circuit with polyimide as the interlayer dielectric layer using known flex circuit manufacturing methods. An example of such flex circuit manufacturing methods are depicted in U.S. Pat. No. 5,885,469 that issued on Mar. 23, 1999 to Kholodenko et al., and assigned to the owner of the present invention (incorporated herein by reference). Such a flex circuit can be attached to the rigid body of the plating fixture by gluing (and possibly curing in an autoclave), or alternatively by suitable fasteners. In the latter case, the inexpensive flex circuit can be used as a replaceable contact circuit in plating cells. Polyimides have generally very good resistance to attack in acidic plating solutions. Other polymeric dielectric can be substituted for polyimide.

Although various embodiments that incorporate the teachings of the present invention have been shown and described in detail herein, those skilled in the art can readily devise many other varied embodiments that still incorporate these teachings.

What is claimed is:

1. An apparatus for supplying electricity to a substrate, comprising:
    a metal deposition system comprising a deposition cell, an anode, and a cathode, the cathode comprising:
        a plurality of contacts,
        a current sensor attached to each of the plurality of contacts, and
        a current regulator that controls current applied to each of the plurality of contacts in response to the current sensor.

2. The apparatus of claim 1, wherein the metal deposition system is an electroplating device.

3. The apparatus of claim 1, further comprising a compliant ridge formed on an external surface and extending out the periphery of each of the plurality of contacts.

4. The apparatus of claim 1, further comprising a controller that determines non-uniformity of current between each of the plurality of contacts.

5. The apparatus of claim 1, wherein the current regulator operates in response to a controller.

6. The apparatus of claim 1, wherein the current regulator ensures that a similar current level is applied to each of the plurality of contacts.

7. The apparatus of claim 1, further comprising a conformal ridge formed around the periphery of each of the plurality of contacts.

8. The apparatus of claim 1, further comprising a power supply that supplies the current to each of the plurality of contacts.

9. The apparatus of claim 8, further comprising a plurality of individual conductors, at least one of the individual conductors connected from the power supply to each of the plurality of contacts.

10. The apparatus of claim 9, wherein the current regulator further comprises a plurality of varistors, at least one of the varistors connected to each of the individual conductors to control current applied to each of the plurality of contacts.

11. The apparatus of claim 9, wherein the current regulator further comprises a current control device that regulates the current over each of the individual conductors.

* * * * *

UNITED STATES PATENT AND TRADEMARK OFFICE
CERTIFICATE OF CORRECTION

PATENT NO. : 6,432,282 B1
DATED : August 13, 2002
INVENTOR(S) : Shamouilian et al.

It is certified that error appears in the above-identified patent and that said Letters Patent is hereby corrected as shown below:

Column 2,
Line 29, please change "surface n an" to -- surface in an --.
Line 56, please change "the resent" to -- the present --.

Signed and Sealed this

First Day of July, 2003

JAMES E. ROGAN
*Director of the United States Patent and Trademark Office*